United States Patent
Ueda et al.

(10) Patent No.: US 12,336,191 B2
(45) Date of Patent: Jun. 17, 2025

(54) MAGNETIC MEMORY INCLUDING TRANSISTORS AND MAGNETORESISTIVE ELEMENTS RESPECTIVELY CONNECTED BETWEEN A CONDUCTIVE PLATE AND A CONDUCTIVE LINE AND ADDITIONAL TRANSISTORS EACH CONNECTED BETWEEN THE CONDUCTIVE LINE AND ANOTHER CONDUCTIVE LINE

(71) Applicant: Kioxia Corporation, Tokyo (JP)

(72) Inventors: Yoshihiro Ueda, Yokohama Kanagawa (JP); Masatoshi Yoshikawa, Tokyo (JP)

(73) Assignee: Kioxia Corporation, Tokyo (JP)

( * ) Notice: Subject to any disclaimer, the term of this patent is extended or adjusted under 35 U.S.C. 154(b) by 87 days.

(21) Appl. No.: 18/176,464

(22) Filed: Feb. 28, 2023

(65) Prior Publication Data
US 2024/0049475 A1    Feb. 8, 2024

(30) Foreign Application Priority Data
Aug. 3, 2022    (JP) .................... 2022-124374

(51) Int. Cl.
*G11C 11/16*    (2006.01)
*H10B 61/00*    (2023.01)
(Continued)

(52) U.S. Cl.
CPC ............ *H10B 61/22* (2023.02); *G11C 11/161* (2013.01); *G11C 11/1673* (2013.01);
(Continued)

(58) Field of Classification Search
CPC ............ G11C 11/161; G11C 11/1673; G11C 11/1675; G11C 11/1697; H10B 61/22; H10N 50/10; H10N 50/80
(Continued)

(56) References Cited

U.S. PATENT DOCUMENTS 7,002,837 B2 * 2/2006 Morimoto ............ H10B 63/80
  365/158
8,837,251 B2    9/2014 Kawahara
(Continued)

FOREIGN PATENT DOCUMENTS

JP    2013140667 A    7/2013
JP    5497930 B2    5/2014
(Continued)

*Primary Examiner* — Sung Il Cho
(74) *Attorney, Agent, or Firm* — Kim & Stewart LLP

(57) ABSTRACT

A magnetic memory includes first conductive lines, a second conductive line, a third conductive line, a fourth conductive line, a conductive layer, magnetoresistive elements, first transistors, a second transistor, and a third transistor. Each magnetoresistive element is arranged between the conductive layer and the second conductive line and includes a first magnetic layer, a second magnetic layer between the first magnetic layer and the second conductive line, and a first non-magnetic layer between the first magnetic layer and the second magnetic layer. Each first transistor is connected between the conductive layer and one of the magnetoresistive elements, and has a gate which is a part of one the first conductive lines. A second transistor is connected between a first end of the second conductive line and the third conductive line. A third transistor is connected between a second end of the second conductive line and the fourth conductive line.

20 Claims, 11 Drawing Sheets

(51) Int. Cl.
*H10N 50/10* (2023.01)
*H10N 50/80* (2023.01)

(52) U.S. Cl.
CPC ...... *G11C 11/1675* (2013.01); *G11C 11/1697* (2013.01); *H10N 50/10* (2023.02); *H10N 50/80* (2023.02)

(58) Field of Classification Search
USPC ........................................................ 365/158
See application file for complete search history.

(56) References Cited

U.S. PATENT DOCUMENTS

| | | | |
|---|---|---|---|
| 9,305,627 B2 | 4/2016 | Hatsuda | |
| 9,905,611 B2 | 2/2018 | Ueda | |
| 12,063,872 B2* | 8/2024 | Sasaki | H10N 50/85 |
| 2012/0092921 A1 | 4/2012 | Ono | |
| 2016/0268500 A1* | 9/2016 | Furuhashi | H10B 61/22 |
| 2017/0077175 A1* | 3/2017 | Ueda | H01L 23/528 |
| 2017/0077177 A1 | 3/2017 | Shimomura | |
| 2017/0263297 A1* | 9/2017 | Matsuoka | G11C 11/1675 |
| 2018/0277746 A1* | 9/2018 | Abe | G11C 11/1659 |
| 2021/0408043 A1* | 12/2021 | Yeong | H10B 51/00 |

FOREIGN PATENT DOCUMENTS

| | | | |
|---|---|---|---|
| JP | 2017059679 A | 3/2017 | |
| JP | 2018157171 A | 10/2018 | |

\* cited by examiner

Read

MAGNETIC MEMORY INCLUDING TRANSISTORS AND MAGNETORESISTIVE ELEMENTS RESPECTIVELY CONNECTED BETWEEN A CONDUCTIVE PLATE AND A CONDUCTIVE LINE AND ADDITIONAL TRANSISTORS EACH CONNECTED BETWEEN THE CONDUCTIVE LINE AND ANOTHER CONDUCTIVE LINE

CROSS-REFERENCE TO RELATED APPLICATION

This application is based upon and claims the benefit of priority from Japanese Patent Application No. 2022-124374, filed Aug. 3, 2022, the entire contents of which are incorporated herein by reference.

FIELD

Embodiments described herein relate generally to a magnetic memory.

BACKGROUND

There is a need for spin orbit torque magnetoresistive random access memory (SOT-MRAM) that has a three-terminal device structure and achieves a high degree of integration and ease of stacking.

DETAILED DESCRIPTION

Embodiments provide a magnetic memory that has a three-terminal device structure and achieves a higher degree of integration and greater ease of stacking.

In general, according to one embodiment, a magnetic memory includes a plurality of first conductive lines extending in a first direction, a second conductive line extending in a second direction intersecting the first direction, a third conductive line, a fourth conductive line, a first conductive layer, a plurality of magnetoresistive elements, each of which is arranged between the first conductive layer and the second conductive line and includes a first magnetic layer, a second magnetic layer between the first magnetic layer and the second conductive line, and a first non-magnetic layer between the first magnetic layer and the second magnetic layer, a plurality of first transistors, each of which is connected between the first conductive layer and a corresponding one of the magnetoresistive elements, and has a gate which is a part of one of the first conductive lines, a second transistor that is connected between a first end of the second conductive line and the third conductive line, a third transistor that is connected between a second end of the second conductive line and the fourth conductive line, and a controller configured to control voltages applied to the first conductive lines, and the third and fourth conductive lines during a read operation or a write operation.

Hereinafter, embodiments will be described with reference to the drawings. The embodiments are not intended to limit the scope of this disclosure. The drawings are schematic or conceptual drawings and the ratio between the portions, for example, is not always identical to the actual ratio. In the specification and drawings, elements which are similar to those described in connection with the already described elements are denoted by the same reference signs and detailed explanations thereof will be omitted as appropriate.

First Embodiment

Figure 1:
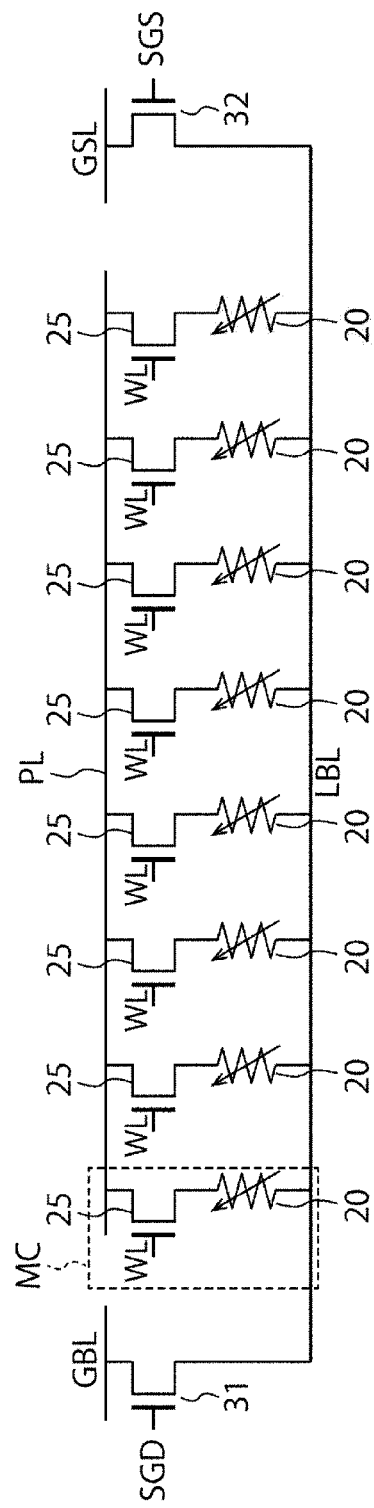
FIG. 1 is a schematic circuit diagram showing a configuration example of a magnetic memory according to a first embodiment.
Figure 2:
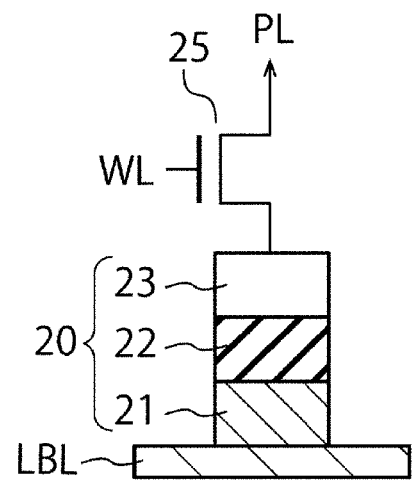
FIG. 2 is a schematic diagram showing a configuration example of a memory cell.

FIG. 1 is a schematic circuit diagram showing a configuration example of a magnetic memory 1 according to a first embodiment. FIG. 2 is a schematic diagram showing a configuration example of a memory cell MC. The magnetic memory 1 of the first embodiment is an SOT-MRAM having a three-terminal device structure, for example. The magnetic memory 1 includes a plurality of word lines WL, a plurality of local bit lines LBL, a plate layer PL, a global bit line GBL, a global source line GSL, and a plurality of memory cells MC.

As shown in FIG. 2, each memory cell MC includes a magnetoresistive element 20 and a cell transistor 25. Each magnetoresistive element 20 is configured with a magnetic layer 21, a non-magnetic layer 22, and a magnetic layer 23 which are stacked. The magnetic layer 21 is provided between the local bit line LBL and the magnetic layer 23. The non-magnetic layer 22 is provided between the magnetic layer 21 and the magnetic layer 23. The magnetic layer 23 has a fixed magnetization direction and is also referred to as a reference layer. The magnetic layer 21 has a variable magnetization direction and is also referred to as a storage layer. Here, having "a variable magnetization direction" means that a magnetization direction can change before and after a write operation and having a "fixed magnetization direction" means that a magnetization direction does not change before and after a write operation. The magnetoresistive element 20 is an MTJ element when the non-magnetic layer 22 is an insulating layer, and the magnetoresistive element 20 is a giant magnetoresistive effect (GMR) element when the non-magnetic layer 22 is a conductive layer. In the present embodiment, the magnetoresistive element 20 may be an MTJ element or a GMR element. Each magnetoresistive element 20 can store one of data "0" and data "1", that is, 1 bit of information.

One of the source and the drain of the cell transistor 25 is electrically connected to the reference layer 23 of the magnetoresistive element 20, the other of the source and the drain of the cell transistor 25 is electrically connected to the plate layer PL, and the gate of the cell transistor 25 is electrically connected to the word line WL. The cell transistor 25 selectively provides an electrical signal to a corresponding magnetoresistive element 20. In this specification, "A is electrically connected to B" means that A may be connected directly to B or A may be connected to B via an electric conductor.

As shown in FIG. 1, a plurality of magnetoresistive elements 20 are connected between one local bit line LBL and the plate layer PL.

One of the source and the drain of a select transistor 31 is electrically connected to one end of the local bit line LBL, the other of the source and the drain of the select transistor 31 is electrically connected to the global bit line GBL, and the gate of the select transistor 31 is electrically connected to a select gate line SGD.

One of the source and the drain of a select transistor 32 is electrically connected to the other end of the local bit line LBL, the other of the source and the drain of the select transistor 32 is electrically connected to the global source line GSL, and the gate of the select transistor 32 is electrically connected to a select gate line SGS.

The select transistors 31 and 32 are connected to the ends of the local bit line LBL and provided for and shared by a plurality of memory cells MC connected to the local bit line LBL. The select transistor 31 electrically connects or disconnects the global bit line GBL to or from one end of the local bit line LBL. The select transistor 32 electrically connects or disconnects the global source line GSL to or from the other end of the local bit line LBL. The select transistors 31 and 32 are non-magnetic layers that generate spin-orbit interaction by passing a current from the global bit line GBL or the global source line GSL through the local bit line LBL. This spin-orbit interaction allows the magnetization state of the magnetic layer 21 of the magnetoresistive element 20 to be rewritten and data to be written into the memory cell MC. The logical value of data to be written into the memory cell MC changes depending on the direction of a current that is passed through the local bit line LBL.

Each of the cell transistor 25 and the select transistors 31 and 32 is an N-type field effect transistor (FET), for example. Each of the cell transistor 25 and the select transistors 31 and 32, however, may be a P-type FET. In the case of the P-type FET, it is only necessary to invert the levels of control signals for the cell transistor 25 and the select transistors 31 and 32 with respect to the levels which are set when each of the cell transistor 25 and the select transistors 31 and 32 is an N-type FET.

The memory cell MC of the present embodiment is SOT-MRAM, for example. In the SOT-MRAM, a current path of a write current through which the write current passes at the time of a write operation and a path of a read current through which the read current passes at the time of a read operation are different. At the time of a write operation, a write current is passed through the local bit line LBL in a first direction from the global bit line GBL to the global source line GSL or in a second direction from the global source line GSL to the global bit line GBL with an assist current being passed through a selected memory cell MC. The assist current is a current that flows in a direction from the local bit line LBL to the plate layer PL or a direction opposite thereto, and is an auxiliary current that flows by a reduction of an energy barrier at the time of a write operation. As described earlier, the logical value of data to be written into a selected memory cell MC is set by the direction (the first direction or the second direction) of a write current that is passed through the local bit line LBL.

At the time of a read operation, a current is passed through a memory cell MC from the local bit line LBL to the plate layer PL or from the plate layer PL to the local bit line LBL. At the time of this current passage, a read current flowing through the memory cell MC or a read voltage which is applied to the memory cell MC changes in accordance with the resistance value of the magnetoresistive element 20 which depends on the magnetization direction of the magnetic layer 21. The logical value of the data stored in the memory cell MC is detected by detecting this read current or read voltage.

As described above, in the SOT-MRAM, a current path of a write current through which the write current passes at the time of a write operation and a path of a read current through which the read current passes at the time of a read operation are different. This eases the design constraint involving the ratio between a read current and a write current and makes it easy to produce the memory in bulk. Moreover, the reliability is improved due to a reduction in electrical stress that is applied to the magnetoresistive element.

In the present embodiment, the local bit line LBL, the plate layer PL, and the select transistors 31 and 32 are shared by a plurality of memory cells MC. This contributes to the achievement of a smaller-size magnetic memory 1. Moreover, the cell transistors 25 of the plurality of memory cells MC connected to the same local bit line LBL are connected to different word lines WL. This makes it possible to connect, between the local bit line LBL and the plate layer PL, only a magnetoresistive element 20 (i.e., a selected element) of one selected memory cell MC of the plurality of memory cells MC connected to the same local bit line LBL and pass the assist current therethrough. Thus, it is possible to selectively write 1-bit data of the logical value corresponding to the direction of the write current of the local bit line LBL into a magnetoresistive element 20 (i.e., a selected element) of one selected memory cell MC. As a result, even when the local bit line LBL, the plate layer PL, and the select transistors 31 and 32 are shared by a plurality of memory cells MC, it is possible to selectively write data into one magnetoresistive element 20 (i.e., a selected element).

Also in a read operation, it is possible to connect, between the local bit line LBL and the plate layer PL, only a magnetoresistive element 20 (i.e., a selected element) of one selected memory cell MC and pass the read current therethrough. As a result, even when the local bit line LBL, the plate layer PL, and the select transistors 31 and 32 are shared by a plurality of memory cells MC, it is possible to selectively read data from one magnetoresistive element 20 (i.e., a selected element).

Figure 3:
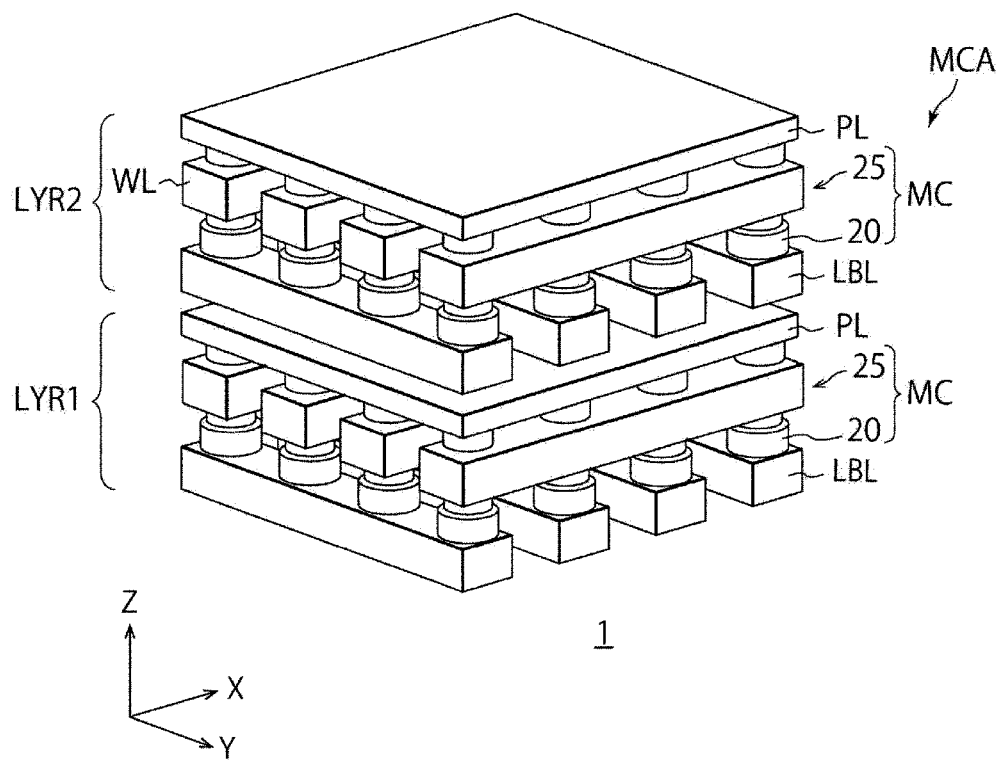
FIG. 3 is a schematic perspective view showing a configuration example of a memory cell array of the magnetic memory according to the first embodiment.

FIG. 3 is a schematic perspective view showing a configuration example of a memory cell array MCA of the magnetic memory 1 according to the first embodiment. The magnetic memory 1 includes a plurality of memory layers LYR1 and LYR2 which are stacked in a Z direction. Since the memory layers LYR1 and LYR2 have the same configuration, only the configuration of the memory layer LYR1 is explained and an explanation of the configuration of the memory layer LYR2 is omitted. Moreover, in the present embodiment, two memory layers LYR1 and LYR2 are stacked, but three or more memory layers may be stacked.

Though not shown in FIG. 3, an interlayer insulating film is provided in the space between the layers. Moreover, the global bit line GBL, the global source line GSL, and the select transistors 31 and 32 are not shown in FIG. 3.

The memory layer LYR1 includes a plurality of word lines WL, a plurality of local bit lines LBL, a plate layer PL, and a plurality of memory cells MC. An X direction and a Y direction are directions intersecting one another (for example, intersecting at right angles). The Z direction is a direction intersecting an X-Y plane (for example, intersecting the X-Y plane at right angles).

The plurality of word lines WL extend in the X direction and are arranged in the Y direction. The plurality of local bit lines LBL extend in the Y direction and are arranged in the X direction. The plate layer PL spreads out on the X-Y plane in a planar fashion. A low-resistance metal material such as copper, aluminum, or tungsten, for example, is used for the word lines WL, the local bit lines LBL, and the plate layer PL.

Each of the plurality of memory cells MC includes a magnetoresistive element 20 and a cell transistor 25. The memory cells MC are provided in such a way that the memory cells MC are at the intersections of the word lines WL and the local bit lines LBL, and they make up the memory cell array MCA. For example, the magnetoresistive element 20 at the intersection of the word line WL and the local bit line LBL and is provided therebetween. The cell transistor 25 is provided for each of the magnetoresistive elements 20, and is connected between the magnetoresistive element 20 and the plate layer PL. The word line WL functions as the gate of the cell transistor 25. IGZO containing indium (In), gallium (Ga), zinc (Zn), and oxygen (O), for example, is used for a channel region of the cell transistor 25. This makes it possible to reduce a leakage current of the cell transistor 25. Moreover, since the cell transistor 25 can be formed at a relatively low temperature, it is possible to form the cell transistor 25 without degradation in the characteristic of the magnetoresistive element 20 after the formation of the magnetoresistive element 20.

As described above, the local bit lines LBL, the memory cells MC, the word lines WL, and the plate layer PL are stacked and they make up the memory layer LYR1. The memory layer LYR2 has the same configuration as the memory layer LYR1 and is stacked on the memory layer LYR1.

Figure 4:
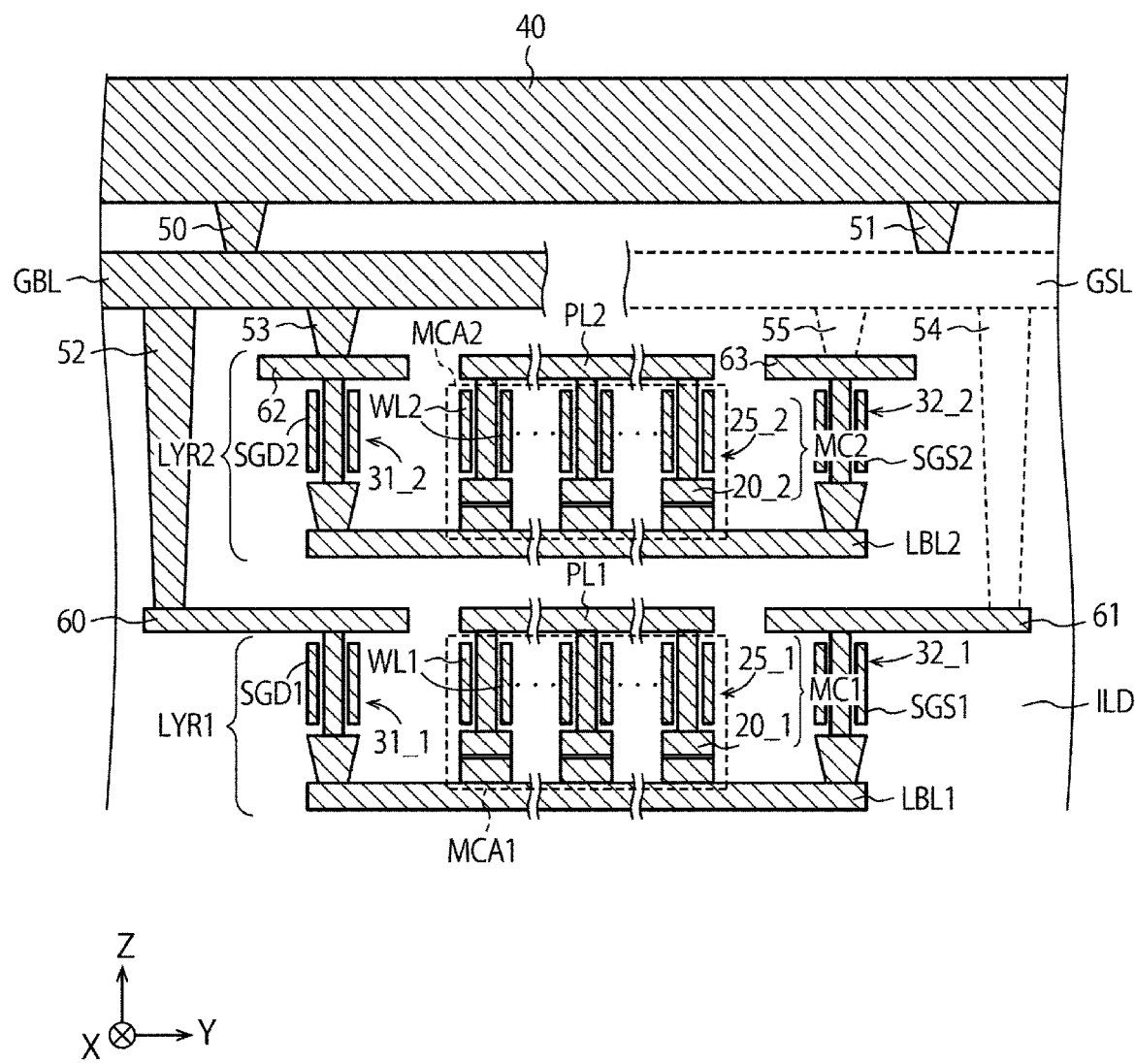
FIG. 4 is a schematic sectional view showing a configuration example of the magnetic memory according to the first embodiment.
Figure 5:
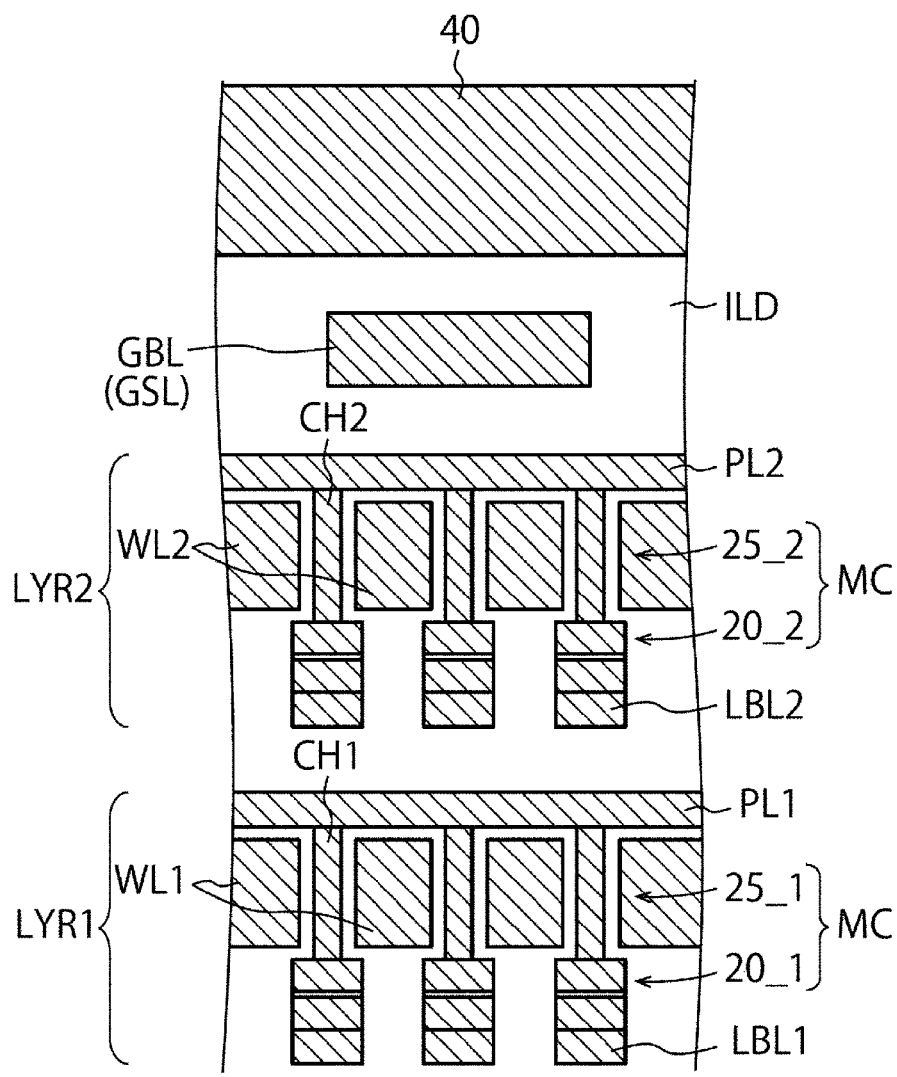
FIG. 5 is a schematic sectional view showing a configuration example of the magnetic memory according to the first embodiment.

FIGS. 4 and 5 are schematic sectional views showing a configuration example of the magnetic memory 1 according to the first embodiment. FIG. 4 shows a cross section in the extension direction (the Y direction) of the local bit lines LBL. FIG. 5 shows a cross section in the extension direction (the X direction) of the word lines WL.

In the magnetic memory 1, the memory layers LYR1 and LYR2 are stacked in the Z direction. Hereinafter, "1" is added to a reference sign of an element in the memory layer LYR1 and "2" is added to a reference sign of an element in the memory layer LYR2.

In the memory layer LYR1, a memory cell array MCA1 is connected between a local bit line LBL1 and a plate layer PL1. Magnetoresistive elements 20_1 of memory cells MC1 are provided on the local bit line LBL1 and cell transistors 25_1 are provided on the magnetoresistive elements 20_1. The plate layer PL1 is provided on the memory cells MC1.

In the memory layer LYR1, select transistors 31_1 and 32_1 are provided in a layer, in which the cell transistors 25_1 are provided, in the corresponding memory cell array MCA1. That is, the select transistors 31_1 and 32_1 are formed in the same process as the cell transistors 25_1 and provided so as to be of about the same height as the cell transistors 25_1 in the stacking direction (the Z direction) of the memory layer LYR1. IGZO containing indium (In), gallium (Ga), zinc (Zn), and oxygen (O), for example, is used for channel regions of the select transistors 31_1 and 32_1. The channel regions of the select transistors 31_1 and 32_1 are configured with the same layer as the channel regions of the cell transistors 25_1. One of the source and the drain of the select transistor 31_1 is electrically connected to the local bit line LBL1, the other of the source and the drain of the select transistor 31_1 is electrically connected to the global bit line GBL via a trace 60 and a via contact 52, and the gate of the select transistor 31_1 is a select gate line SGD1. One of the source and the drain of the select transistor 32_1 is electrically connected to the local bit line LBL1, the other of the source and the drain of the select transistor 32_1 is electrically connected to the global source line GSL via a trace 61 and a via contact 54, and the gate of the select transistor 32_1 is a select gate line SGS1. All of the channel regions of the cell transistors 25_1 and the select transistors 31_1 and 32_1 may be configured with IGZO. Alternatively, a part of the channel regions of the cell transistors 25_1 and the select transistors 31_1 and 32_1 may be configured with IGZO.

The memory layer LYR2 basically has the same configuration as the memory layer LYR1. Therefore, select transistors 31_2 and 32_2 of the memory layer LYR2 are formed in the same process as cell transistors 25_2 and provided so as to be of about the same height as the cell transistors 25_2 of the memory layer LYR2 in the stacking direction (the Z direction) of the memory layer LYR2. The memory layer LYR2 and the select transistors 31_2 and 32_2 are formed after the formation of the memory layer LYR1 and the select transistors 31_1 and 32_1 and provided in a layer above the memory layer LYR1 and the select transistors 31_1 and 32_1. One of the source and the drain of the select transistor 31_2 of the memory layer LYR2 is electrically connected to a corresponding local bit line LBL2, the other of the source and the drain of the select transistor 31_2 is electrically connected to the global bit line GBL via a trace 62 and a via contact 53, and the gate of the select transistor 31_2 is a select gate line SGD2. One of the source and the drain of the select transistor 32_2 of the memory layer LYR2 is electrically connected to the local bit line LBL2, the other of the source and the drain of the select transistor 32_2 is electrically connected to the global source line GSL via a trace 63 and a via contact 55, and the gate of the select transistor 32_2 is a select gate line SGS2. The global bit line GBL and the global source line GSL are shared by the memory layers LYR1 and LYR2 and the select transistors 31_1, 31_2, 32_1, and 32_2.

Figure 6:
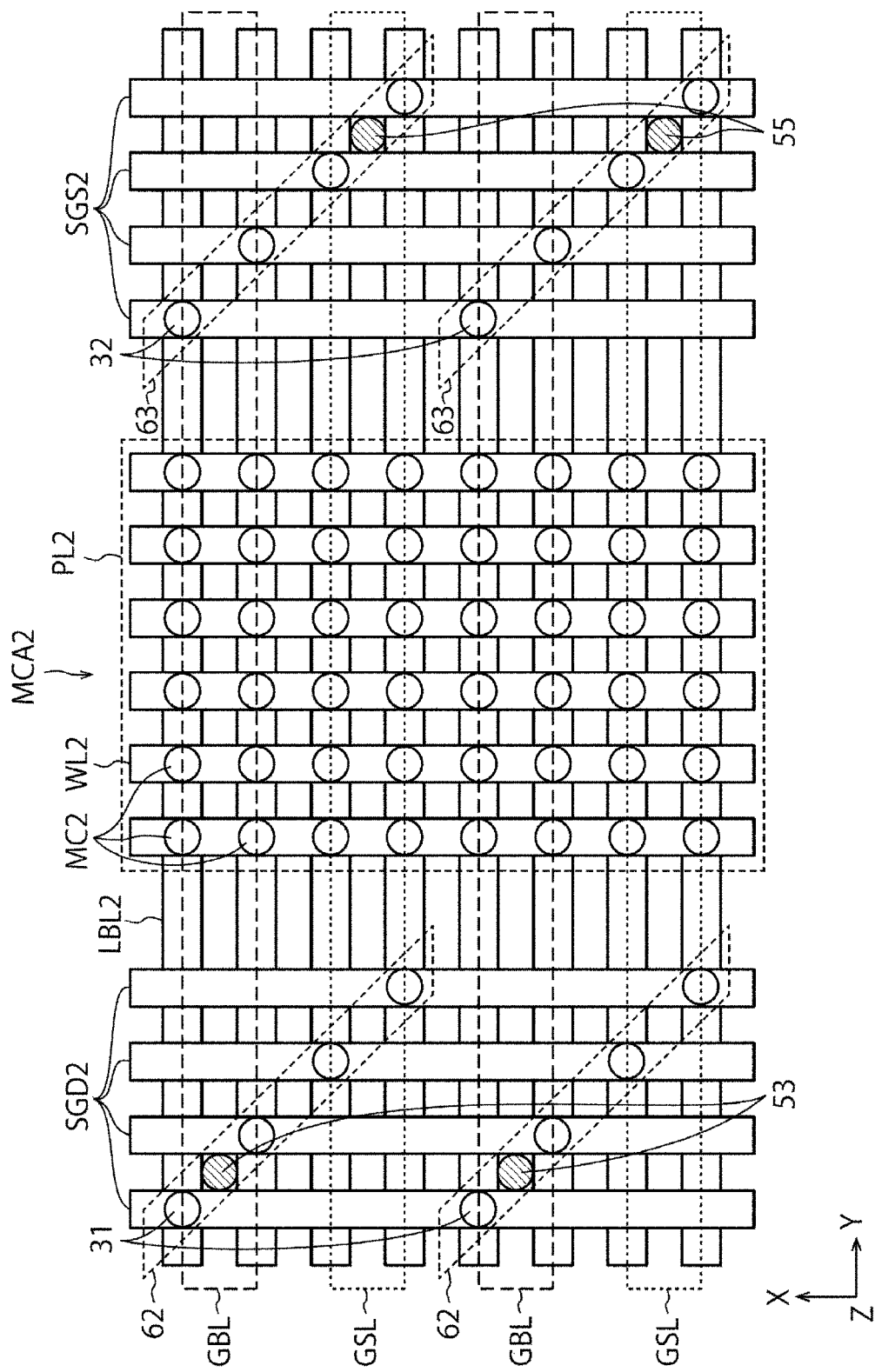
FIG. 6 is a schematic plan view showing a configuration example of the magnetic memory according to the first embodiment.

The global bit line GBL and the global source line GSL are provided above the memory layers LYR1 and LYR2 and shared by the memory layers LYR1 and LYR2. The global bit line GBL and the global source line GSL are formed in the same layer and alternately arranged in the X direction as shown in FIG. 6. The global bit line GBL is electrically connected to the trace 60 via the via contact 52 and electrically connected to the trace 62 via the via contact 53. The global source line GSL is electrically connected to the trace 61 via the via contact 54 and electrically connected to the trace 63 via the via contact 55.

A controller 40 is provided above the global bit line GBL and the global source line GSL. The controller 40 is a logic circuit that controls the memory layers LYR1 and LYR2, and is configured with a complementary metal oxide semiconductor (CMOS) circuit, for example. The controller 40 is electrically connected to the global bit line GBL via a via contact 50. Moreover, the controller 40 is electrically connected to the global source line GSL via a via contact 51. The controller 40 controls the memory layers LYR1 and LYR2 to execute a write operation, a read operation or the like.

An interlayer insulating film ILD is provided between the memory layers LYR1 and LYR2 and the like.

A word line WL1 shown in FIG. 5 is provided around channel regions CH1 of a plurality of cell transistors 25_1 arranged in the X direction in a state in which the word line WL1 is electrically insulated from the channel regions CH1. The word line WL1 is provided in such a way that the word line WL1 is shared by the plurality of cell transistors 25_1 arranged in the X direction. Therefore, when a voltage is applied to the word line WL1, the plurality of cell transistors 25_1 arranged in the X direction are driven almost simultaneously.

A word line WL2 is provided around channel regions CH2 of a plurality of cell transistors 25_2 arranged in the X direction in a state in which the word line WL2 is electrically insulated from the channel regions CH2. The word line WL2 is provided in such a way that the word line WL2 is shared by the plurality of cell transistors 25_2 arranged in the X direction. Therefore, when a voltage is applied to the word line WL2, the plurality of cell transistors 25_2 arranged in the X direction are driven almost simultaneously.

FIG. 6 is a schematic plan view showing a configuration example of the magnetic memory 1 according to the first embodiment. FIG. 6 illustrates the memory layer LYR2 and the memory layer LYR1 located below the memory layer LYR2 is not shown therein.

When viewed in a plan view from the Z direction, the global bit line GBL and the global source line GSL extend in the Y direction and are alternately arranged in the X direction. The global bit line GBL and the global source line GSL are formed in the same layer as described earlier and electrically insulated from each other.

The traces 62 and 63 extend in the X-Y plane in a direction inclined with respect to the X and Y directions. The traces 62 and 63 are formed on the same layer as a plate layer PL2. The trace 62 is provided on the side where the select transistor 31 is located, and is electrically connected to the global bit line GBL via the via contact 53. Moreover, the trace 62 is provided in such a way that the trace 62 is shared by as many select transistors 31 as the select gate lines SGD2.

The trace 63 is provided on the side where the select transistor 32 is located, and is electrically connected to the global source line GSL via the via contact 55. Moreover, the trace 63 is provided in such a way that the trace 63 is shared by as many select transistors 32 as the select gate lines SGS2. In FIG. 6, the trace 62 is common-connected to four select transistors 31 and the trace 63 is common-connected to four select transistors 32. Therefore, a voltage of a global bit line GBL is applied to four select transistors 31 via the trace 62 and a voltage of a global source line GSL adjacent to the global bit line GBL is applied to four select transistors 32 via the trace 63. The number of select gate lines SGD2 and the number of select gate lines SGS2, however, are not limited to four.

Of a plurality of select transistors 31 that share a global bit line GBL and of a plurality of select transistors 32 that share a global source line GSL, select transistors 31 and 32 that correspond to selected one column (one local bit line LBL) are driven. This allows the global bit line GBL and the global source line GSL to be connected to the ends of the one local bit line LBL via the select transistors 31 and 32 and to supply power thereto from the controller 40.

A plurality of memory cells MC2 are provided below the plate layer PL2 in such a way that the memory cells MC2 are respectively located at the intersections of a plurality of word lines WL2 and a plurality of local bit lines LBL2. As shown in FIG. 6, the plurality of memory cells MC2 make up a memory cell array MCA2 two-dimensionally arranged in the X direction and the Y direction.

Though not shown in FIG. 6, by referring to the planar layout of the memory layer LYR2, the traces 62 and 63, the via contacts 53 and 55 and the like, and FIGS. 4 and 5, the planar layout of the memory layer LYR1, the traces 60 and 61, and the via contacts 52 and 54 can be easily understood.

As described above, according to the present embodiment, the select transistors 31 and 32 are connected to one end and the other end, respectively, of a local bit line LBL and provided for each local bit line LBL. Moreover, a plurality of memory cells MC are common-connected to the local bit line LBL. Therefore, the select transistors 31 and 32 are shared by the plurality of memory cells MC connected to the same local bit line LBL. That is, in the SOT-MRAM having a three-terminal device structure, the cell transistor 25 is provided for each memory cell MC and the select transistors 31 and 32 are shared by the plurality of memory cells MC connected to the same local bit line LBL. This contributes to the achievement of a high degree of integration and smaller size SOT-MRAM with a three-terminal device structure.

Furthermore, providing the select transistors 31 and 32 for each memory cell array MCA makes it easy to stack a plurality of memory cell arrays MCA1 and MCA2 as the memory layers LYR1 and LYR2 while achieving a smaller size magnetic memory 1.

Next, an operation of the magnetic memory 1 is explained.

Write Operation

Figure 7:
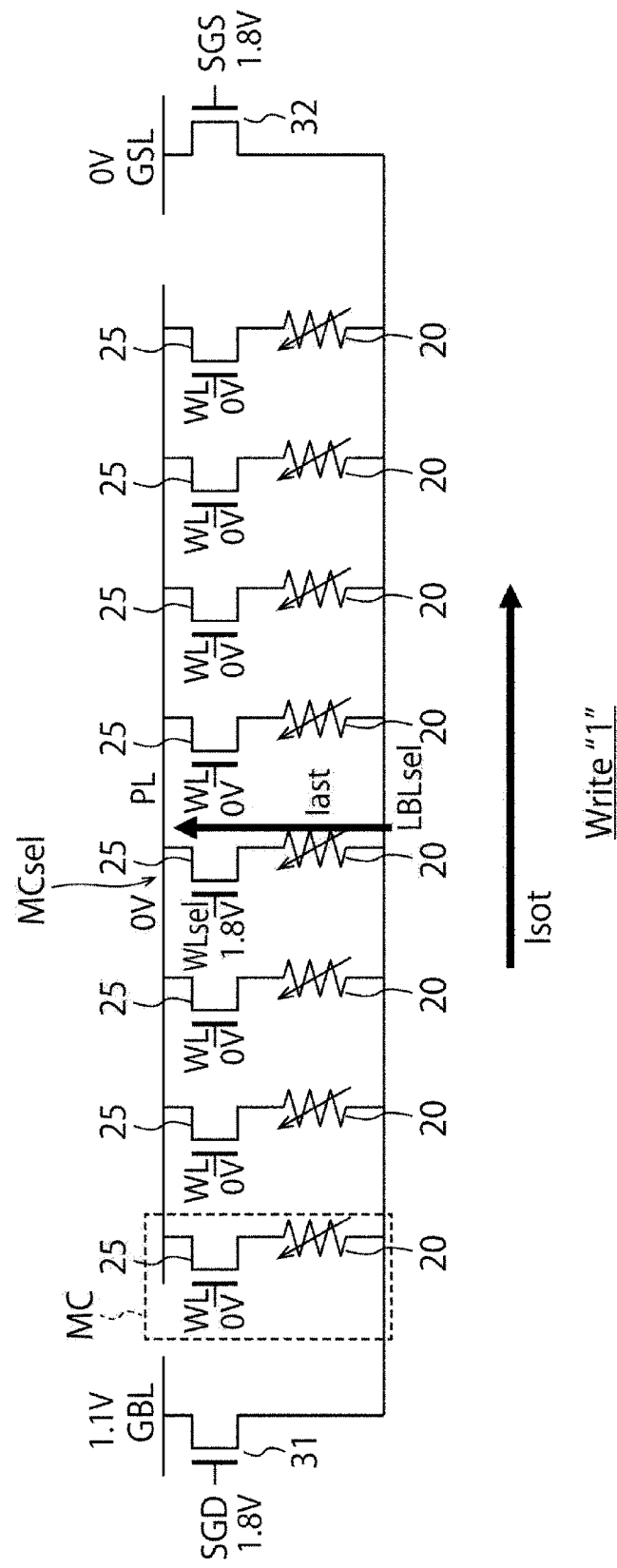
FIG. 7 is a diagram showing an operation to write a first logical value into a selected memory cell connected to a selected local bit line and a selected word line.

FIG. 7 is a diagram showing an operation to write a first logical value into a selected memory cell MCsel connected to a selected local bit line LBLsel and a selected word line WLsel. A write operation of the present embodiment employs what is called a voltage control of magnetic anisotropy (VCMA) write system.

When writing the first logical value (for example, data "1"), the controller 40 applies a write voltage V1 (for example, 1.1 V) to the global bit line GBL and applies a reference voltage V0 (for example, a ground voltage 0 V) lower than the write voltage V1 to the global source line GSL and the plate layer PL. Moreover, the controller 40 raises the voltage of the selected word line WLsel to a select voltage V2 (for example, 1.8 V) and causes the cell transistor 25 of the selected memory cell MCsel to transition to a conductive state. The controller 40 maintains non-selected word lines WL at the reference voltage V0. In addition, the controller 40 raises the voltages of the select gate lines SGD and SGS corresponding to the selected local bit line LBLsel to a select voltage V3 (for example, 1.8 V) and causes the select transistors 31 and 32 connected to the selected local bit line LBLsel to transition to a conductive state. The select gate lines SGD and SGS corresponding to a non-selected local bit line LBL are maintained at the reference voltage V0 and the select transistors 31 and 32 at the ends of the non-selected local bit line LBL are in a non-conductive state.

This causes a write current Isot to flow in a direction from the global bit line GBL to the global source line GSL via the selected local bit line LBLsel. The magnetization direction of the magnetoresistive element 20 of the selected memory cell MCsel is determined by the spin-orbit interaction depending on the direction of this write current Isot. Moreover, when the write current Isot flows, an assist current last flows to the plate layer PL from the selected local bit line LBLsel through the selected memory cell MCsel. The assist current last facilitates writing of data into the selected memory cell MCsel. As a result, the first logical value (for example, the data "1") is written into the selected memory cell MCsel.

Figure 8:
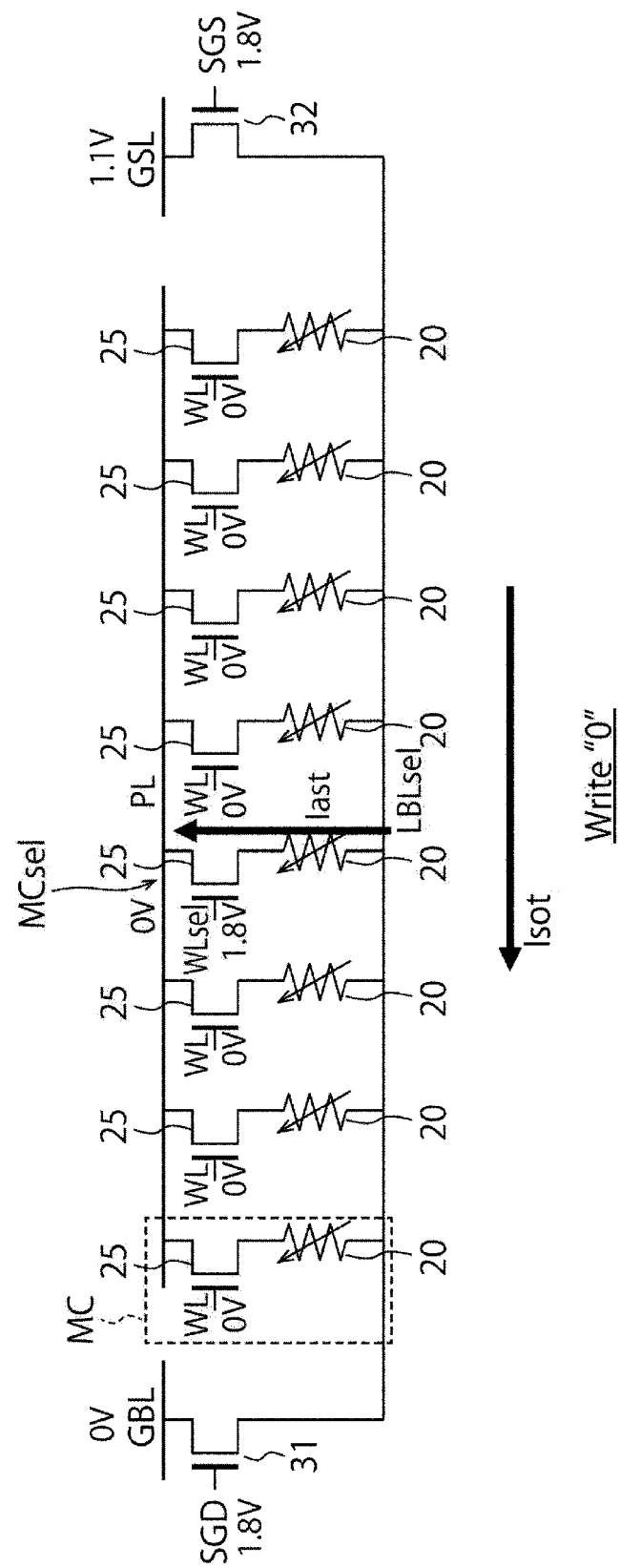
FIG. 8 is a diagram showing an operation to write a second logical value into a selected memory cell connected to a selected local bit line and a selected word line.

FIG. 8 is a diagram showing an operation to write a second logical value into a selected memory cell MCsel connected to a selected local bit line LBLsel and a selected word line WLsel.

When writing the second logical value (for example, data "0"), the controller 40 applies the reference voltage V0 (for example, the ground voltage 0 V) to the global bit line GBL and applies the write voltage V1 (for example, 1.1 V) to the global source line GSL and the plate layer PL. The voltages of the other lines: the selected word line WLsel, non-selected word lines WL, and the select gate lines SGD and SGS may be the same as those in the first logical value write operation. As a result, the cell transistor 25 of the selected memory cell MCsel and the select transistors 31 and 32 connected to the selected local bit line LBLsel transition to a conductive state.

This causes the write current Isot to flow in a direction from the global source line GSL to the global bit line GBL via the selected local bit line LBLsel. The magnetization direction of the magnetoresistive element 20 of the selected memory cell MCsel is determined by the spin-orbit interaction depending on the direction of this write current Isot. Moreover, when the write current Isot flows, the assist current last flows to the plate layer PL from the selected local bit line LBLsel through the selected memory cell MCsel. The assist current last facilitates writing of data into the selected memory cell MCsel. As a result, the second logical value (for example, the data "0") is written into the selected memory cell MCsel.

Read Operation

Figure 9:
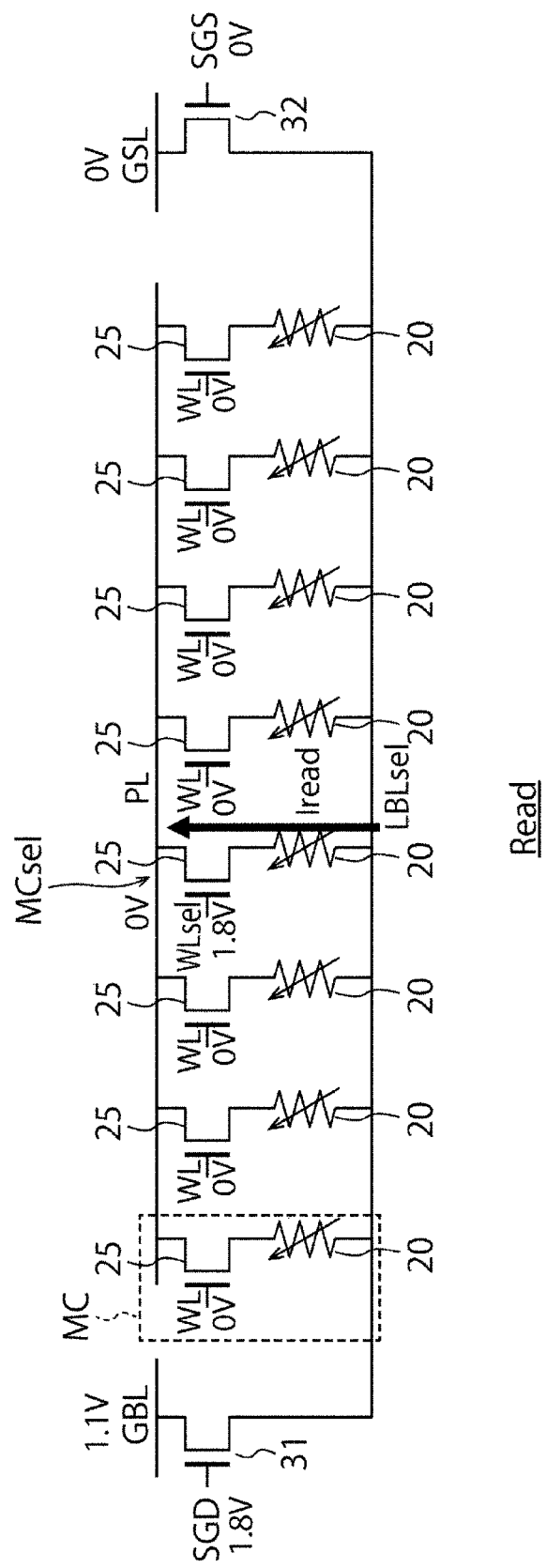
FIG. 9 is a diagram showing an operation to read data from a selected memory cell connected to a selected local bit line and a selected word line.

FIG. 9 is a diagram showing an operation to read data from a selected memory cell MCsel connected to a selected local bit line LBLsel and a selected word line WLsel.

In a read operation, the controller 40 applies a read voltage V4 (for example, 1.1 V) to the global bit line GBL and applies the reference voltage V0 (for example, the ground voltage 0 V) lower than the read voltage V4 to the global source line GSL and the plate layer PL. Moreover, the controller 40 raises the voltage of the selected word line WLsel to the select voltage V2 (for example, 1.8 V) and causes the cell transistor 25 of the selected memory cell MCsel to transition to a conductive state. The controller 40 maintains non-selected word lines WL at the reference voltage V0. In addition, the controller 40 raises the voltage of the select gate line SGD corresponding to the selected local bit line LBLsel to the select voltage V3 (for example, 1.8 V) and causes the select transistor 31 connected to the selected local bit line LBLsel to transition to a conductive state. On the other hand, the controller 40 maintains the select gate line SGS corresponding to the selected local bit line LBLsel at the reference voltage V0. Therefore, the select transistor 32 connected to the selected local bit line LBLsel remains in a non-conductive state. The select gate lines SGD and SGS corresponding to a non-selected local bit line LBL are maintained at the reference voltage V0 and the select transistors 31 and 32 at the ends of the non-selected local bit line LBL are in a non-conductive state.

This causes a read current Tread to flow from the selected local bit line LBLsel to the plate layer PL. Since the select transistor 32 connected to the selected local bit line LBLsel is in a non-conductive state, almost no current flows through the selected local bit line LBLsel.

The non-selected local bit line LBL is in an electrically floating state because the non-selected local bit line LBL is electrically separated from the global bit line GBL and the global source line GSL by the select transistors 31 and 32.

As a result, the voltage of the global bit line GBL changes depending on the read current Tread flowing through the selected memory cell MCsel. The controller 40 has a sense amplifier and determines the logical value of the data stored in the selected memory cell MCsel by detecting the voltage of the global bit line GBL. Alternatively, the sense amplifier of the controller 40 determines the logical value of the data stored in the selected memory cell MCsel by detecting the current flowing through the global bit line GBL.

As described above, the magnetic memory 1 according to the present embodiment can selectively write data into a memory cell MC or selectively read data from a memory cell MC.

Second Embodiment

Figure 10:
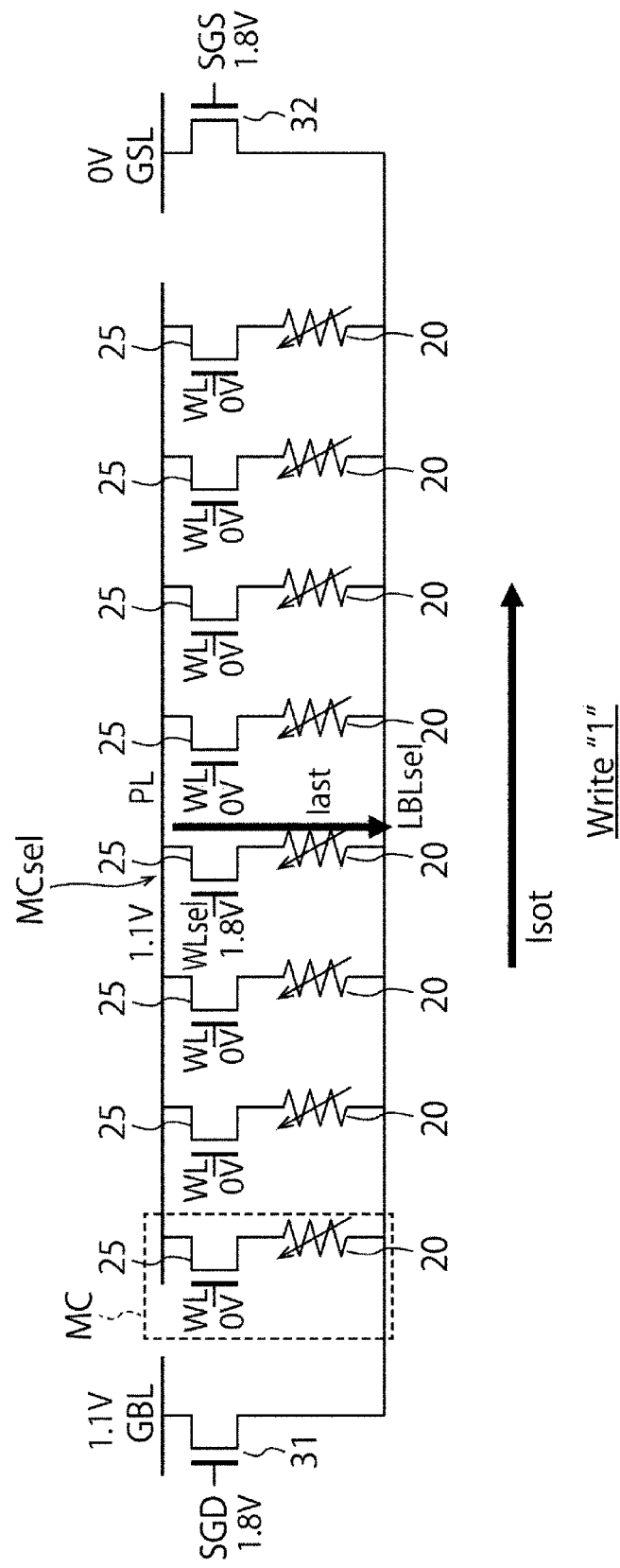
FIGS. 10-12 are each a diagram showing a write operation according to a second embodiment.
Figure 11:
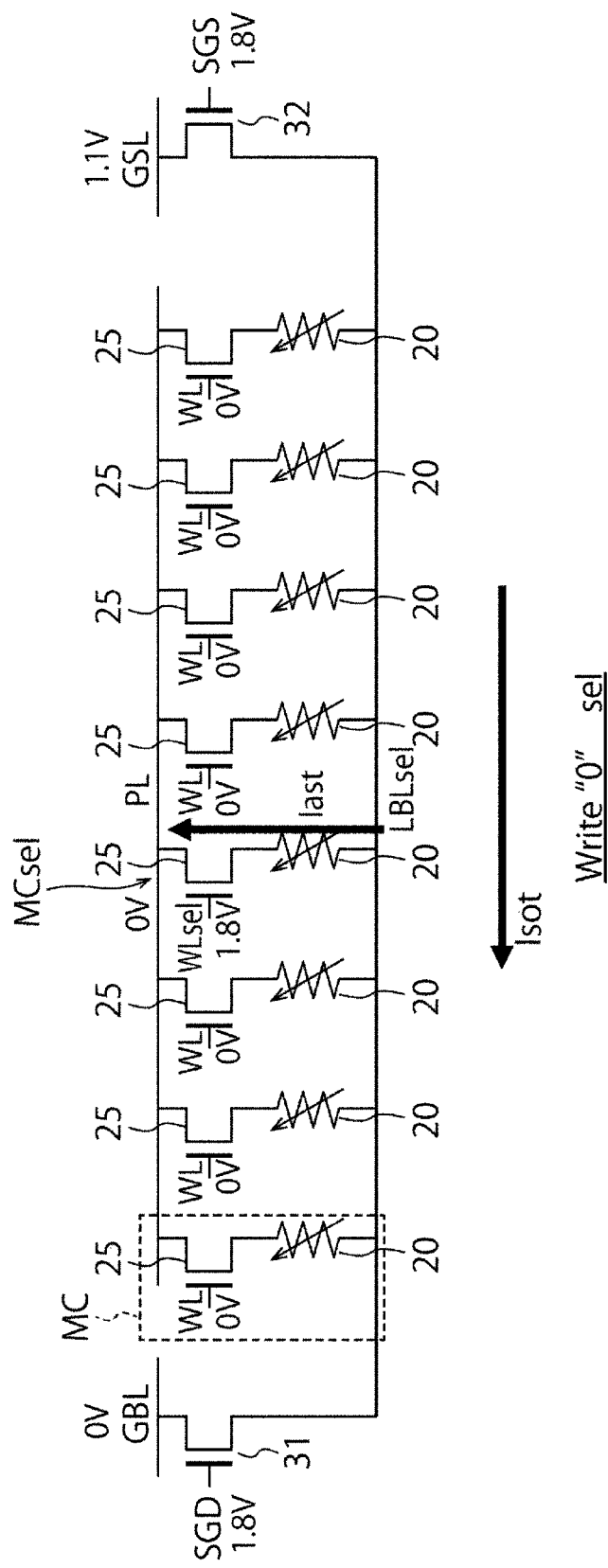
Figure 12:
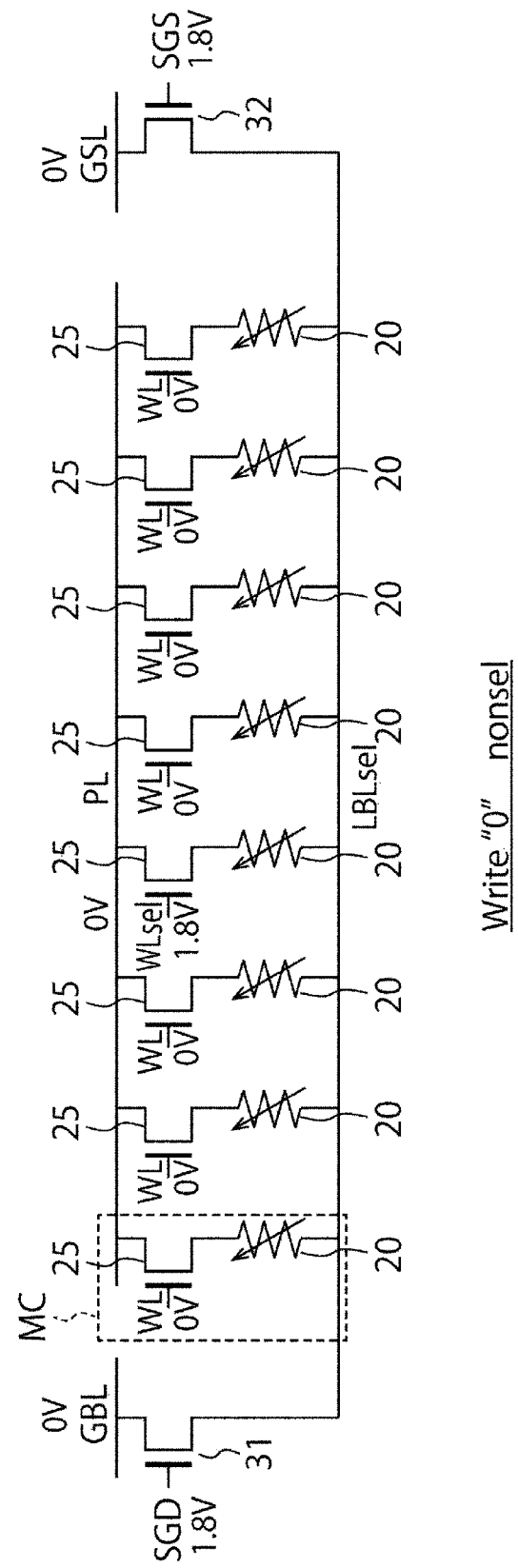

FIGS. 10 to 12 are diagrams showing a write operation according to a second embodiment. In the second embodiment, what is called a spin transfer torque (STT) assisted write system is used. In the STT assisted write system, a first logical value (for example, data "1") is written into all of a plurality of memory cells MC connected to a selected word line WLsel. Then, a second logical value (for example, data "0") is selectively written into a memory cell MC, into which the second logical value is to be written, of the plurality of memory cells MC connected to the selected word line WLsel.

First, as shown in FIG. 10, when writing the first logical value (for example, data "1"), the controller 40 applies a write voltage V1 (for example, 1.1 V) to the global bit line GBL and the plate layer PL and applies a reference voltage V0 (for example, a ground voltage 0 V) lower than the write voltage V1 to the global source line GSL. Moreover, the controller 40 raises the voltage of the selected word line WLsel to a select voltage V2 (for example, 1.8 V) and causes the cell transistors 25 of all the memory cells MC connected to the selected word line WLsel to transition to a conductive state. The controller 40 maintains non-selected word lines WL at the reference voltage V0. In addition, the controller 40 raises the voltages of the select gate lines SGD and SGS corresponding to all the local bit lines LBL intersecting the selected word line WLsel to a select voltage V3 (for example, 1.8 V) and causes the select transistors 31 and 32 connected to all the local bit lines LBL intersecting the selected word line WLsel to transition to a conductive state.

This causes a write current Isot to flow in a direction from the global bit line GBL to the global source line GSL via all the local bit lines LBL intersecting the selected word line WLsel. Moreover, when the write current Isot flows, an assist current last flows from the plate layer PL to the local bit lines LBL through all the memory cells MC connected to the selected word line WLsel. As a result, the first logical value is written into all the memory cells MC connected to the selected word line WLsel depending on the direction in which the write current Isot flows.

Next, as shown in FIG. 11, the second logical value (for example, data "0") is selectively written into a memory cell MC, into which the second logical value is to be written, of the plurality of memory cells MC connected to the selected word line WLsel. In this case, the controller 40 applies the write voltage V1 (for example, 1.1 V) to the global source line GSL and applies the reference voltage V0 (for example, the ground voltage 0 V) to the global bit line GBL and the plate layer PL. Moreover, the controller 40 raises the voltage of the selected word line WLsel to the select voltage V2 (for example, 1.8 V) and causes the cell transistors 25 of all the memory cells MC connected to the selected word line WLsel to transition to a conductive state. The controller 40 maintains the non-selected word lines WL at the reference voltage V0. In addition, the controller 40 raises the voltages of the select gate lines SGD and SGS corresponding to at least one selected local bit line LBLsel, which was selected, of a plurality of local bit lines LBL intersecting the selected word line WLsel to the select voltage V3 (for example, 1.8 V) and causes the select transistors 31 and 32 connected to the selected local bit line LBLsel to transition to a conductive state.

As a result, the voltages of the global bit line GBL and the global source line GSL are applied to the selected local bit line LBLsel. Therefore, the write current Isot flows in a direction from the global source line GSL to the global bit line GBL via the selected local bit line LBLsel. Moreover, when the write current Isot flows, the assist current Iast flows from the selected local bit line LBLsel to the plate layer PL through a memory cell MC connected to the selected local bit line LBLsel. As a result, the second logical value is written into at least one selected memory cell MCsel, which was selected, of the plurality of memory cells MC connected to the selected word line WLsel depending on the direction in which the write current Isot flows.

On the other hand, the second logical value is not written into a memory cell MC, which should maintain the first logical value, of the plurality of memory cells MC connected to the selected word line WLsel. In this case, as shown in FIG. 12, the controller 40 applies the reference voltage V0 to the global bit line GBL and the global source line GSL which are connected to a non-selected local bit line LBLnonsel other than the selected local bit line LBLsel. This allows almost no write current Isot to flow through even non-selected local bit lines LBLnonsel that share the selected word line WLsel and the select gate lines SGD and SGS. Moreover, the assist current Iast does not flow through a non-selected memory cell MC between the non-selected local bit line LBLnonsel and the plate layer PL. This makes it possible to prevent writing of the second logical value.

A read operation of the second embodiment may be the same as the read operation of the first embodiment. Moreover, the configuration of the second embodiment may be the same as the configuration of the first embodiment. Therefore, the second embodiment can obtain the same effects as those of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic memory comprising:
   a plurality of first conductive lines extending in a first direction;
   a second conductive line extending in a second direction intersecting the first direction;
   a third conductive line;
   a fourth conductive line;
   a first conductive plate that is electrically isolated from the third conductive line and the fourth conductive line;
   a plurality of magnetoresistive elements, each of which is arranged between the first conductive plate and the second conductive line and includes a first magnetic layer, a second magnetic layer between the first magnetic layer and the second conductive line, and a first non-magnetic layer between the first magnetic layer and the second magnetic layer;
   a plurality of first transistors, each of which is connected between the first conductive plate and a corresponding one of the magnetoresistive elements, and has a gate which is a part of one of the first conductive lines;
   a second transistor that is connected between a first end of the second conductive line and the third conductive line;
   a third transistor that is connected between a second end of the second conductive line and the fourth conductive line; and
   a controller configured to control voltages applied to the first conductive lines, and the third and fourth conductive lines during a read operation or a write operation.

2. The magnetic memory according to claim 1, wherein during a first write operation to write a first logical value into a selected element among the plurality of magnetoresistive elements, the controller causes each of the first transistors connected to the selected element and the second and third transistors to transition to a conductive state, and applies a first voltage to the third conductive line and a second voltage lower than the first voltage to the fourth conductive line, and
during a second write operation to write a second logical value into the selected element, the controller causes each of the first transistor connected to the selected element and the second and third transistors to transition to a conductive state, and applies the second voltage to the third conductive line and the first voltage to the fourth conductive line.

3. The magnetic memory according to claim 2, wherein the controller applies the second voltage to the first conductive plate during each of the first and second write operations.

4. The magnetic memory according to claim 2, wherein the controller applies the first voltage to the first conductive plate during the first write operation and the second voltage to the first conductive plate during the second write operation.

5. The magnetic memory according to claim 4, further comprising:
   a plurality of additional second conductive lines, each extending in the second direction; and
   a plurality of additional magnetoresistive elements, each of which is arranged between the first conductive plate and one of the additional second conductive lines,
   wherein, during the first write operation, the controller causes a current to flow through each of the additional second conductive lines.

6. The magnetic memory according to claim 1, wherein a plurality of memory layers are stacked in a third direction that intersects with the first and second directions, one of the memory layers including the magnetoresistive elements, which are stacked above the second conductive line in the third direction.

7. The magnetic memory according to claim 6, wherein the third and fourth conductive lines are shared by the plurality of memory layers.

8. The magnetic memory according to claim 7, wherein the third and fourth conductive lines extend in the second direction.

9. The magnetic memory according to claim 1, wherein channel regions of the first, second, and third transistors are formed using one layer.

10. The magnetic memory according to claim 1, wherein at least one of the first, second, and third transistors has a channel region made of a material containing indium (In), gallium (Ga), zinc (Zn), and oxygen (O).

11. A method of performing a read operation or a write operation in a magnetic memory comprising a plurality of first conductive lines extending in a first direction, a second conductive line extending in a second direction intersecting the first direction, a third conductive line, a fourth conductive line, a first conductive plate that is electrically isolated from the third conductive line and the fourth conductive line, a plurality of magnetoresistive elements, wherein each of the magnetoresistive elements is arranged between the first conductive plate and the second conductive line and includes a first magnetic layer, a second magnetic layer between the first magnetic layer and the second conductive line, and a first non-magnetic layer between the first magnetic layer and the second magnetic layer, a plurality of first transistors, wherein each of the first transistors is connected between the first conductive plate and a corresponding one of the magnetoresistive elements and has a gate which is a part of one of the first conductive lines, a second transistor that is connected between a first end of the second conductive line and the third conductive line, and a third transistor that is connected between a second end of the second conductive line and the fourth conductive line, said method comprising:
during a first write operation to write a first logical value into a selected element among the plurality of magnetoresistive elements, transitioning each of the first transistors connected to the selected element and the second and third transistors to a conductive state, and applying a first voltage to the third conductive line and a second voltage lower than the first voltage to the fourth conductive line, and
during a second write operation to write a second logical value into the selected element, transitioning each of the first transistors connected to the selected element and the second and third transistors to a conductive state, and applying the second voltage to the third conductive line and the first voltage to the fourth conductive line.

12. The method according to claim 11, further comprising:
applying the second voltage to the first conductive plate during each of the first and second write operations.

13. The method according to claim 11, further comprising:
applying the first voltage to the first conductive plate during the first write operation; and
applying the second voltage to the first conductive plate during the second write operation.

14. The method according to claim 13, wherein
the magnetic memory further comprises a plurality of additional second conductive lines, each extending in the second direction, and a plurality of additional magnetoresistive elements, each of which is arranged between the first conductive plate and one of the additional second conductive lines, and
the method further comprises:
during the first write operation, causing a current to flow through each of the additional second conductive lines.

15. The method according to claim 11, wherein a plurality of memory layers are stacked in a third direction that intersects with the first and second directions, one of the memory layers including the magnetoresistive elements, which are stacked above the second conductive line in the third direction.

16. The method according to claim 15, wherein the third and fourth conductive lines are shared by the plurality of memory layers.

17. The method according to claim 16, wherein the third and fourth conductive lines extend in the second direction.

18. The method according to claim 11, wherein channel regions of the first, second, and third transistors are formed using one layer.

19. The method according to claim 11, wherein at least one of the first, second, and third transistors has a channel region made of a material containing indium (In), gallium (Ga), zinc (Zn), and oxygen (O).

20. The method according to claim 11, wherein
during a read operation on the selected element, transitioning each of the first transistors connected to the selected element and the second transistor to a conductive state while maintaining the third transistor in a non-conductive state, and applying a first voltage to the third conductive line and a second voltage lower than the first voltage to the fourth conductive line.

* * * * *